US009832890B2

(12) United States Patent
Min (10) Patent No.: US 9,832,890 B2
(45) Date of Patent: Nov. 28, 2017

(54) COVER WINDOW, METHOD OF MANUFACTURING THE COVER WINDOW, AND DISPLAY DEVICE INCLUDING THE COVER WINDOW

(71) Applicant: SAMSUNG DISPLAY CO., LTD., Yongin, Gyeonggi-Do (KR)

(72) Inventor: Myung An Min, Asan-si (KR)

(73) Assignee: SAMSUNG DISPLAY CO., LTD., Yongin, Gyeonggi-Do (KR)

( * ) Notice: Subject to any disclaimer, the term of this patent is extended or adjusted under 35 U.S.C. 154(b) by 165 days.

(21) Appl. No.: 14/630,768

(22) Filed: Feb. 25, 2015

(65) Prior Publication Data
US 2016/0066456 A1 Mar. 3, 2016

(30) Foreign Application Priority Data

Sep. 3, 2014 (KR) .................. 10-2014-0117097

(51) Int. Cl.
*G06F 3/041* (2006.01)
*G06F 3/044* (2006.01)
(Continued)

(52) U.S. Cl.
CPC ............ *H05K 5/0017* (2013.01); *G06F 1/16* (2013.01); *H04M 1/0249* (2013.01);
(Continued)

(58) Field of Classification Search
CPC ........................................ G06F 2203/04107
See application file for complete search history.

(56) References Cited

U.S. PATENT DOCUMENTS 8,730,415 B2 * 5/2014 Omote .................. G06F 3/044
345/173
8,773,848 B2 * 7/2014 Russell-Clarke ..... C03B 23/245
345/179
(Continued)

FOREIGN PATENT DOCUMENTS

CN 202404554 U * 8/2012
CN 102810020 A * 12/2012
(Continued)

OTHER PUBLICATIONS

Machine translation of CN 204184116 U, obtained using Google Patent on Dec. 26, 2016.*
(Continued)

*Primary Examiner* — Aaron Austin
*Assistant Examiner* — Zheren J Yang
(74) *Attorney, Agent, or Firm* — Lee & Morse P.C.

(57) ABSTRACT

A cover window includes a light-transmitting substrate, a metal layer pattern on the light-transmitting substrate, the metal layer pattern being in a peripheral region of the light-transmitting substrate, a first light-blocking layer pattern on the metal layer pattern, a second light-blocking layer pattern extending from the light-transmitting substrate to the first light-blocking layer pattern, the second light-blocking layer pattern covering inner side surfaces of the metal layer pattern and the first light-blocking layer pattern, and a light-transmitting area on the light-transmitting substrate, the light-transmitting area being surrounded by the second light-blocking layer pattern.

11 Claims, 11 Drawing Sheets

(51) Int. Cl.
*H05K 5/00* (2006.01)
*H04M 1/02* (2006.01)
*G06F 1/16* (2006.01)

(52) U.S. Cl.
CPC ....... *H04M 1/0266* (2013.01); *H04M 1/0283* (2013.01); *H05K 5/0086* (2013.01); *G06F 2203/04107* (2013.01); *Y10T 428/24545* (2015.01); *Y10T 428/24612* (2015.01)

(56) References Cited

U.S. PATENT DOCUMENTS

| | | | | |
|---|---|---|---|---|
| 2008/0158173 | A1* | 7/2008 | Hamblin | G06F 1/1626 345/173 |
| 2011/0080542 | A1* | 4/2011 | Huang | G02F 1/136209 349/106 |
| 2011/0089010 | A1* | 4/2011 | Hsu | B44F 1/08 200/5 A |
| 2012/0056824 | A1* | 3/2012 | Liu | G06F 3/041 345/173 |
| 2013/0094184 | A1* | 4/2013 | Lee | G02F 1/133512 362/97.1 |
| 2013/0106727 | A1* | 5/2013 | Juan | G06F 3/044 345/173 |
| 2013/0106746 | A1* | 5/2013 | Lai | G06F 3/041 345/173 |
| 2014/0063361 | A1* | 3/2014 | Lo | G06F 1/16 349/12 |
| 2014/0124341 | A1* | 5/2014 | Park | G06F 3/041 200/293 |
| 2014/0127442 | A1* | 5/2014 | Ryu | H05K 5/0086 428/38 |
| 2014/0300835 | A1* | 10/2014 | Chu | G06F 3/0412 349/12 |
| 2014/0362308 | A1* | 12/2014 | Chen | G06F 3/041 349/12 |
| 2015/0015800 | A1* | 1/2015 | Yang | G06F 3/0416 349/12 |
| 2015/0054762 | A1* | 2/2015 | Lin | G06F 3/03547 345/173 |
| 2015/0062454 | A1* | 3/2015 | Hao | G06F 3/044 349/12 |
| 2015/0077654 | A1* | 3/2015 | Chu | G06F 1/169 349/12 |
| 2015/0116245 | A1* | 4/2015 | Tseng | G06F 3/047 345/173 |
| 2015/0169109 | A1* | 6/2015 | Park | G06F 3/044 345/174 |
| 2015/0346861 | A1* | 12/2015 | Wong | G06F 3/044 345/174 |
| 2016/0109971 | A1* | 4/2016 | Harada | G06F 3/041 345/173 |
| 2016/0154527 | A1* | 6/2016 | Jiang | G06F 3/041 345/173 |
| 2016/0370902 | A1* | 12/2016 | Aridomi | B32B 27/06 |
| 2017/0029648 | A1* | 2/2017 | Asada | C08F 283/12 |
| 2017/0131814 | A1* | 5/2017 | Aridomi | G06F 3/0412 |
| 2017/0160834 | A1* | 6/2017 | Kim | G06F 3/044 |

FOREIGN PATENT DOCUMENTS

| | | | |
|---|---|---|---|
| CN | 203025672 U | * | 6/2013 |
| CN | 103294274 A | * | 9/2013 |
| CN | 103331986 A | * | 10/2013 |
| CN | 204184116 U | * | 3/2015 |
| JP | 2014142496 A | * | 8/2014 |
| KR | 10-2008-0063103 A | | 7/2008 |
| KR | 10-2013-0123000 A | | 11/2013 |
| KR | 10-2014-0012405 A | | 2/2014 |
| KR | 10-2014-0057127 A | | 5/2014 |
| TW | 484742 U | * | 8/2014 |

OTHER PUBLICATIONS

Machine translation of JP 2014/142496 A, obtained from EPO on Dec. 23, 2016.*
Machine Translation of CN 202404554 U, obtained from Google Patent on Jul. 7, 2017.*
Machine Translation of CN 103331986 A, obtained from Google Patent on Jul. 7, 2017.*
Machine Translation of CN 102810020 A, obtained from Google Patent on Dec. 24, 2016.*
Machine Translation of CN 203025672 U, obtained from Google Patent on Dec. 23, 2016.*
Machine Translation of CN 103294274 A, obtained from Google Patent on Jul. 8, 2017.*

* cited by examiner

COVER WINDOW, METHOD OF MANUFACTURING THE COVER WINDOW, AND DISPLAY DEVICE INCLUDING THE COVER WINDOW

CROSS-REFERENCE TO RELATED APPLICATION

Korean Patent Application No. 10-2014-0117097 filed on Sep. 3, 2014, in the Korean Intellectual Property Office, and entitled: "Cover Window, Method of Manufacturing the Cover Window, and Display Device Including the Cover Window," is incorporated by reference herein in its entirety.

BACKGROUND

1. Field

Embodiments relate to a cover window, a method of manufacturing the cover window, and a display device including the cover window.

2. Description of the Related Art

A display device typically includes a cover window to protect a display panel, which displays an image, from external impact. A typical cover window may include a light-transmitting area which transmits light and a light-blocking area which surrounds the light-transmitting area. In the typical cover window, the light-blocking area is monochromatic, e.g., black.

SUMMARY

According to an embodiment, there may be provided a cover window including a light-transmitting substrate, a metal layer pattern on the light-transmitting substrate, the metal layer pattern being in a peripheral region of the light-transmitting substrate, a first light-blocking layer pattern on the metal layer pattern, a second light-blocking layer pattern extending from the light-transmitting substrate to the first light-blocking layer pattern, the second light-blocking layer pattern covering inner side surfaces of the metal layer pattern and the first light-blocking layer pattern, and a light-transmitting area on the light-transmitting substrate, the light-transmitting area being surrounded by the second light-blocking layer pattern.

The cover window may further include a raised and recessed pattern layer which is interposed between the light-transmitting substrate and the metal layer pattern and has a raised and recessed pattern on a surface thereof.

The cover window may further include a third light-blocking layer pattern which is formed on a surface of the second light-blocking layer pattern and covers the surface of the first light-blocking layer pattern.

A groove may be formed in the inner side surface of the metal layer pattern.

A groove may be formed in the inner side surface of the first light-blocking layer pattern.

According to another embodiment, there may be provided a display device including a cover window; and a display panel which displays an image in a light-transmitting area of the cover window, wherein the cover window comprises: a light-transmitting substrate; a metal layer pattern which is formed on a surface of a periphery of the light-transmitting substrate; a first light-blocking layer pattern which is formed on the whole of a surface of the metal layer pattern; a second light-blocking layer pattern which extends from a surface of the light-transmitting substrate to a surface of the first light-blocking layer pattern and covers an inner side surface of the metal layer pattern and the surface and an inner side surface of the first light-blocking layer pattern; and the light-transmitting area which is surrounded by the second light-blocking layer pattern.

The cover window may further include a raised and recessed pattern layer which is interposed between the light-transmitting substrate and the metal layer pattern and has a raised and recessed pattern on a surface thereof.

The cover window may further include a third light-blocking layer pattern which is formed on a surface of the second light-blocking layer pattern and covers the surface of the first light-blocking layer pattern.

A groove may be formed in the inner side surface of the metal layer pattern.

A groove may be formed in the inner side surface of the first light-blocking layer pattern.

According to another embodiment, there may be provided a method of manufacturing a cover window including depositing a metal layer on the whole of a surface of a light-transmitting substrate; performing a first printing operation of forming a first light-blocking layer pattern on a surface of a periphery of the metal layer; forming a metal layer pattern by partially removing the metal layer using the first light-blocking pattern layer as a mask; and performing a second printing operation of forming a light-blocking area and a light-transmitting area surrounded by the light-blocking area by continuously forming a second light-blocking layer pattern from the surface of the light-transmitting substrate to a surface of the first light-blocking layer pattern such that the second light-blocking layer pattern covers the surface and an inner side surface of the first light-blocking layer pattern and an inner side surface of the metal layer pattern.

The method may further include forming a raised and recessed pattern layer by coating a layer of ultraviolet (UV) curable resin on a surface of a periphery of a light-transmitting substrate, forming a raised and recessed pattern on a surface of the layer of UV curable resin, and curing the raised and recessed pattern by irradiating UV light to the raised and recessed pattern. The metal layer may depositing on a surface of the raised and recessed pattern layer and the first light-blocking layer pattern on a surface of the metal layer may cover the whole of the surface of the raised and recessed pattern layer.

The method may further include performing a third printing operation of covering a surface of the metal layer pattern by forming a third light-blocking layer on a surface of the second light-blocking layer pattern.

BRIEF DESCRIPTION OF THE DRAWINGS

Features will become apparent to those of ordinary skill in the art by describing in detail exemplary embodiments with reference to the attached drawings, in which.

DETAILED DESCRIPTION

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of elements and regions may be exaggerated for clarity of illustration. It will also be understood that when a layer or element is referred to as being "on" another element or substrate, it can be directly on the other element or substrate, or intervening elements may also be present. Further, it will be understood that when an element is referred to as being "connected" or "coupled" to another element, it can be directly connected or coupled, or one or more intervening elements may also be present. In addition, it will also be understood that when a layer is referred to as being "between" two layers, it can be the only layer between the two layers, or one or more intervening layers may also be present. In contrast, when an element is referred to as being, e.g., "directly on," "directly connected to" or "directly coupled to", another element or layer, there are no intervening elements or layers present. As used herein, connected may refer to elements being physically, electrically and/or fluidly connected to each other.

Like reference numerals refer to like elements throughout. As used herein, the term "and/or" includes any and all combinations of one or more of the associated listed items.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the embodiments.

Spatially relative terms, such as "below," "lower," "under," "above," "upper" and the like, may be used herein for ease of description to describe the relationship of one element or feature to another element(s) or feature(s) as illustrated in the figures. It will be understood that the spatially relative terms are intended to encompass different orientations of the device in use or operation, in addition to the orientation depicted in the figures. For example, if the device in the figures is turned over, elements described as "below" or "beneath" relative to other elements or features would then be oriented "above" relative to the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting. As used herein, the singular forms "a," "an" and "the" are intended to include the plural forms as well, unless the context clearly indicates otherwise. It will be further understood that the terms "comprises," "comprising," "includes" and/or "including," when used in this specification, specify the presence of stated features, integers, operations, elements, and/or components, but do not preclude the presence or addition of one or more other features, integers, steps, operations, elements, components, and/or groups thereof.

Figure 1:
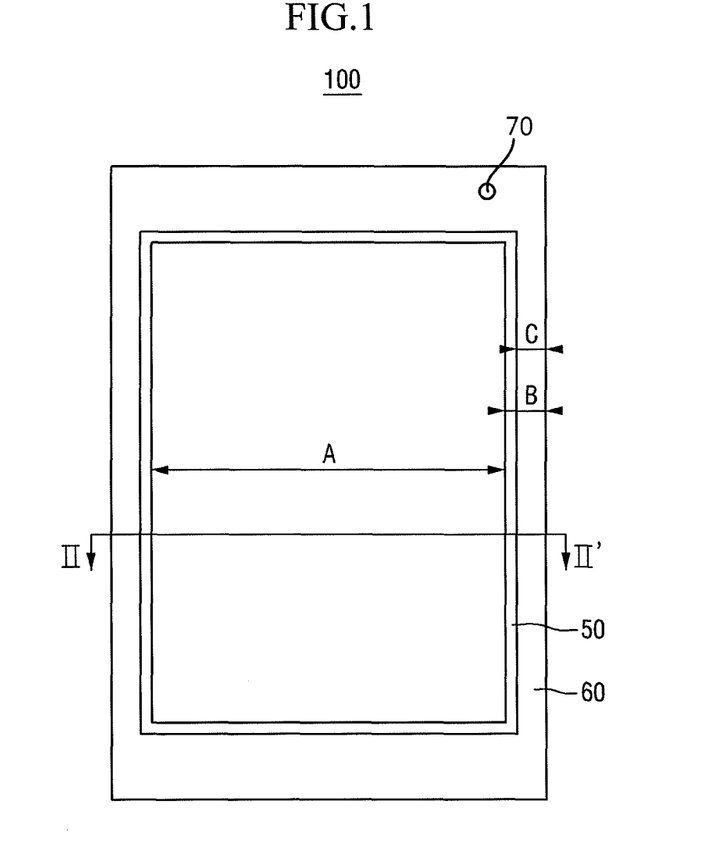
FIG. 1 illustrates a plan view of a cover window according to an embodiment.

FIG. 1 illustrates a plan view of a cover window 100 according to a first embodiment.

Referring to FIG. 1, the cover window 100 may be divided into a light-transmitting area A, which displays an image of a display panel, and a light-blocking area B. The light-blocking area B may be divided into a first area C and a second area BC. The first area C surrounds the second area BC, i.e., the second area BC is between the light-transmitting area A and the first area C of the light-blocking area B. A light-transmitting area 70, in which a camera is installed, may be formed in the light-blocking area B.

Figure 2:
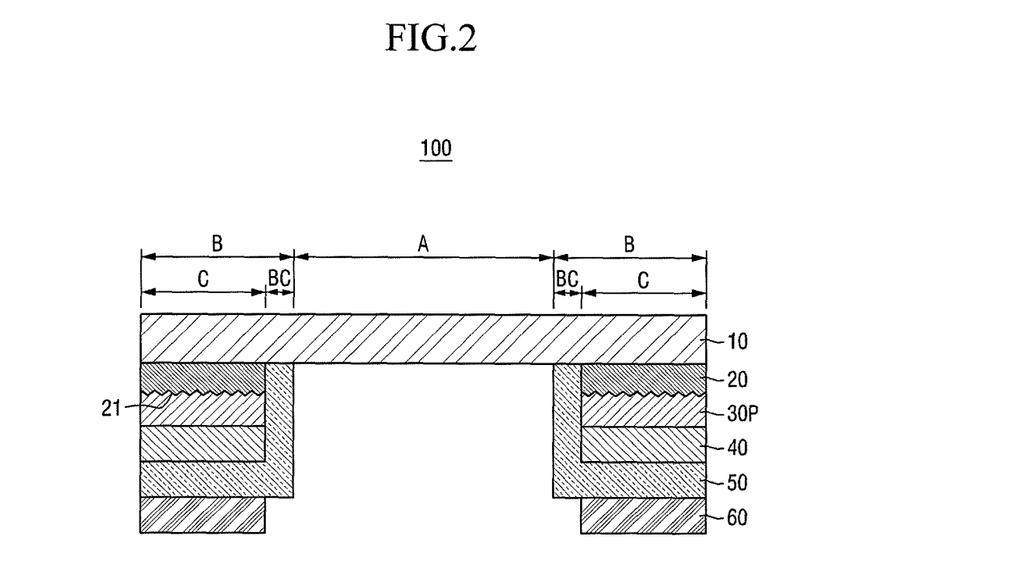
FIG. 2 illustrates a cross-sectional view taken along line II-II' of FIG. 1.

FIG. 2 illustrates a cross-sectional view taken along line II-II' of FIG. 1. Referring to FIGS. 1 and 2, the light-blocking area B may be formed in a periphery of a light-transmitting substrate 10, and the light-transmitting area A may be surrounded by the light-blocking area B. For example, the light-transmitting area A of the light-transmitting substrate 10 transmits visible light therethrough.

As illustrated in FIG. 2, a raised and recessed pattern layer 20, a metal layer pattern 30P, a first light-blocking layer pattern 40, a second light-blocking layer pattern 50, and a third light-blocking layer pattern 60 may be formed in the light-blocking area B of the light-transmitting substrate 10. In detail, the raised and recessed pattern layer 20, the metal layer pattern 30P, the first light-blocking layer pattern 40, the second light-blocking layer pattern 50, and the third light-blocking layer pattern 60 may be sequentially formed in the first area C of the light-blocking area B.

A raised and recessed pattern 21 may be formed on a surface of the raised and recessed pattern layer 20. The raised and recessed pattern 21 may be implemented as a hair-line pattern, i.e., a thin line pattern.

The metal layer pattern 30P may be formed on the whole surface of the raised and recessed pattern layer 20, i.e., the metal layer pattern 30P may be formed on the entire surface of the raised and recessed pattern layer 20 that faces away from the light-transmitting substrate 10. For example, as illustrated in FIG. 2, the metal layer pattern 30P may completely overlap the raised and recessed pattern layer 20, such that the first area C may be entirely covered with the metal layer pattern 30P. The metal layer pattern 30P may be formed, e.g., only, in the first area C of the light-blocking area B. Therefore, the metal layer pattern 30P may give the first area C of the light-blocking area B a metallic texture, i.e., the metal layer pattern 30P may impart the periphery (first area C) of the of the light-blocking area B a metallic appearance, e.g., a metallic-looking frame.

The first light-blocking layer pattern 40 may be formed on the whole surface of the metal layer pattern 30P, i.e., the first light-blocking layer pattern 40 may be formed on the entire surface of the metal layer pattern 30P that faces away from the light-transmitting substrate 10. The second light-blocking layer pattern 50 may be formed on the whole surface of the first light-blocking layer pattern 40. The third light-blocking layer pattern 60 may be formed on the whole surface of the second light-blocking layer pattern 50. The third light-blocking layer pattern 60 may be formed in an area overlapping the raised and recessed pattern layer 20, the metal layer pattern 30P, and the first light-blocking layer pattern 40. In the drawings, the third light-blocking layer pattern 60 covers an overlap area of the raised and recessed pattern layer 20, the metal layer pattern 30P, and the first light-blocking layer pattern 40, but embodiments are not limited thereto.

In the second area BC of the light-blocking area B, the second light-blocking layer pattern 50 may be formed on the surface of the light-transmitting substrate 10 and may be continuous with the second light-blocking layer pattern 50 of the first area C. That is, the second light-blocking layer pattern 50 may extend from the surface of the light-transmitting substrate 10 of the second area BC to the surface of the first light-blocking layer pattern 40 of the first area C. The second light-blocking layer pattern 50 may cover an inner side surface of the raised and recessed pattern layer 20, an inner side surface of the metal layer pattern 30P, and an inner side surface and the surface of the first light-blocking layer pattern 40. The light-transmitting area A may be formed inside the second light-blocking layer pattern 50.

FIGS. 3 through 9 illustrate views of stages in a method of manufacturing the cover window 100.

Figure 3:
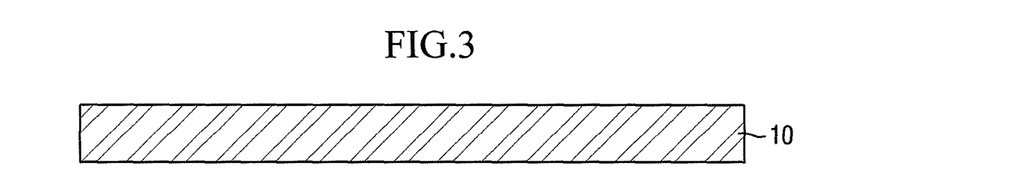
FIGS. 3 through 9 illustrate views of stages in a method of manufacturing the cover window of FIG. 1.
Figure 4:
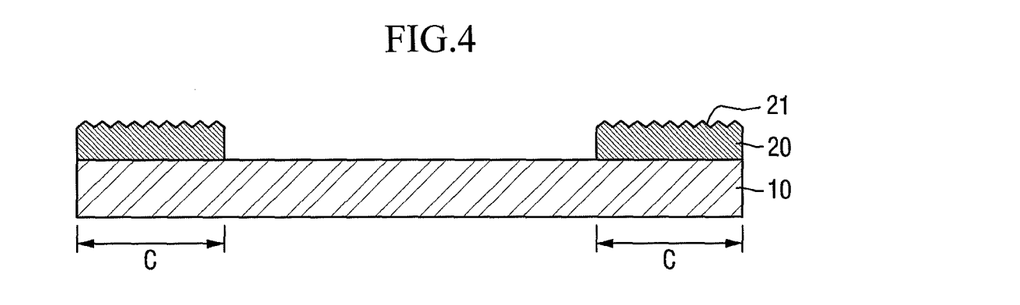

Referring to FIGS. 3 and 4, the raised and recessed pattern layer 20 may be formed on a surface of the periphery of the light-transmitting substrate 10. The light-transmitting substrate 10 may be a transparent polymer film, e.g., glass, polyethylene terephthalate (PET), polymethyl methacrylate (PMMA), etc.

The periphery of the light-transmitting substrate 10 corresponds to the first area C of the light-blocking area B. The raised and recessed pattern layer 20 may be formed by coating a layer of ultraviolet (UV) curable resin on the first area C, forming the raised and recessed pattern 21 on a surface of the layer of UV curable resin, and then curing the raised and recessed pattern 21 by irradiating UV light to the raised and recessed pattern 21.

Figure 5:
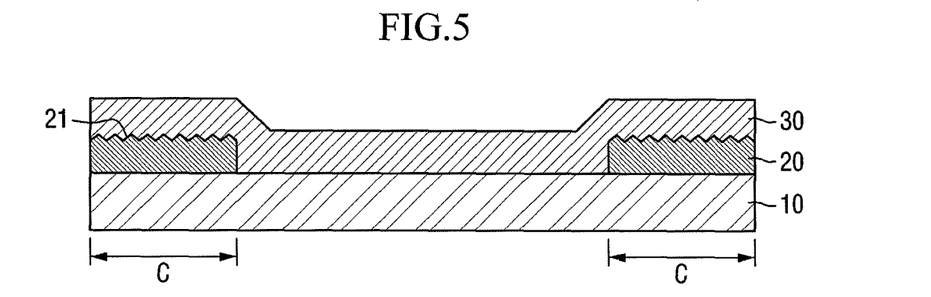

Referring to FIG. 5, a metal layer 30 may be deposited on the whole surface of the raised and recessed pattern layer 20 and the whole surface of the light-transmitting substrate 10, i.e., the metal layer 30 may be deposited to cover exposed surfaces of the raised and recessed pattern layer 20 and the light-transmitting substrate 10. A step corresponding to a thickness of the raised and recessed pattern layer 20 may be formed on a surface of the metal layer 30. In an example, the metal layer 30 may be made of titanium oxide ($TiO_2$), silicon oxide ($SiO_2$), etc.

Figure 6:
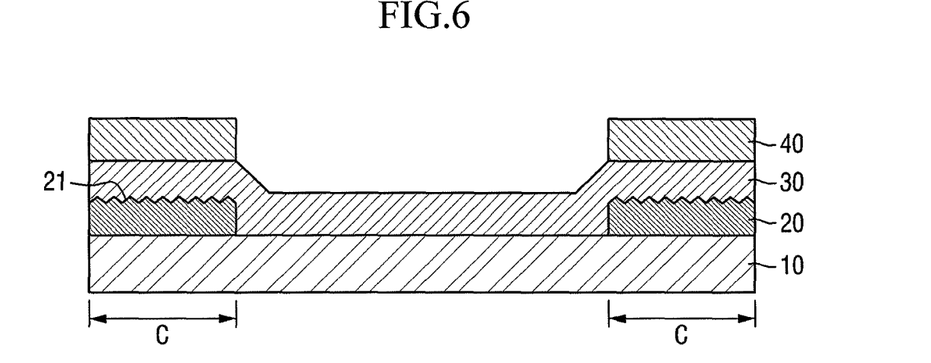

Referring to FIG. 6, the first light-blocking layer pattern 40 may be formed on the surface of the metal layer 30 of the first area C. The first light-blocking layer pattern 40 may cover the whole surface of the metal layer 30 of the first area C, e.g., the first light-blocking layer pattern 40 may be only on a portion of the metal layer 30 in the first area C. The first light-blocking layer pattern 40 may be a first printed layer printed in colored or colorless ink.

Figure 7:
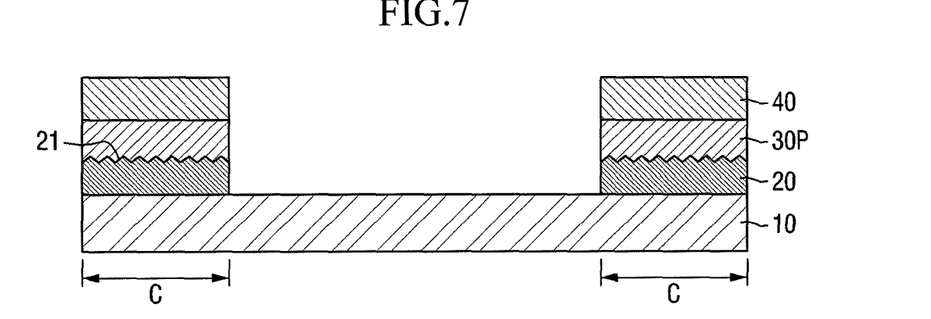

Referring to FIG. 7, the metal layer 30 may be partially removed using the first light-blocking layer pattern 40 of the first area C as a mask. In detail, the metal layer 30, excluding a portion protected by the first light-blocking layer pattern 40 of the first area C, may be removed by etching to form the metal layer pattern 30P.

The raised and recessed pattern layer 20, the metal layer pattern 30P, and the first light-blocking layer pattern 40 may be sequentially stacked on the surface of the light-transmitting substrate 10 in the first area C only. That is, no overlayers may exist on the surface of the light-transmitting substrate 10 between portions of the first area C.

Figure 8:
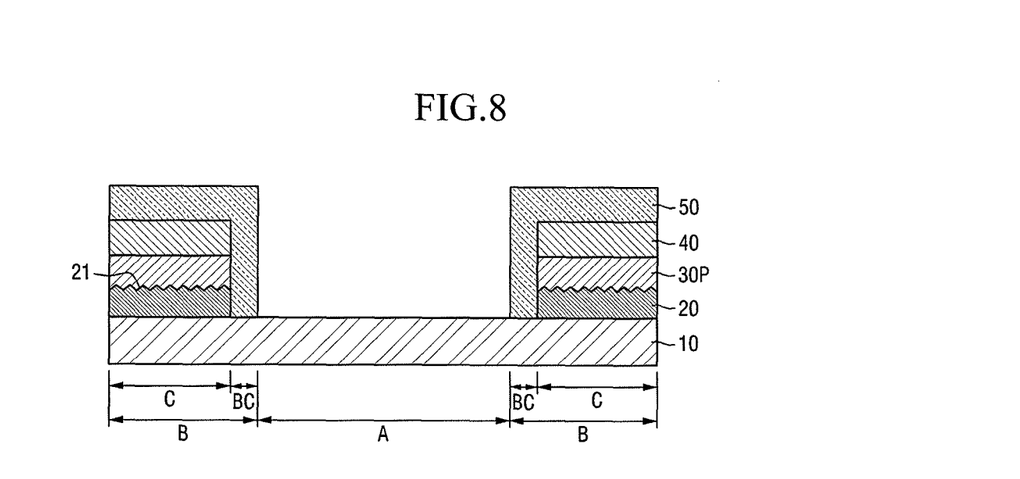

Referring to FIG. 8, the second light-blocking layer pattern 50 may be formed to extend from the surface of the light-transmitting substrate 10 to the surface of the light-blocking layer pattern 40. The surface of the light-transmitting substrate 10 having the second light-blocking layer pattern 50 corresponds to the second area BC of the light-blocking area B. As described above, the second light-blocking layer pattern 50 may cover the inner side surface of the raised and recessed pattern layer 20, the inner side surface of the metal layer pattern 30P, and the surface and the inner side surface of the first light-blocking layer pattern 40. The light-transmitting area A may be formed between portions of the second light-blocking layer pattern 50. As described above, the light-transmitting area A is surrounded by the light-blocking area B. The second light-blocking layer pattern 50 may be a second printed layer printed in colored or colorless ink.

Figure 9:
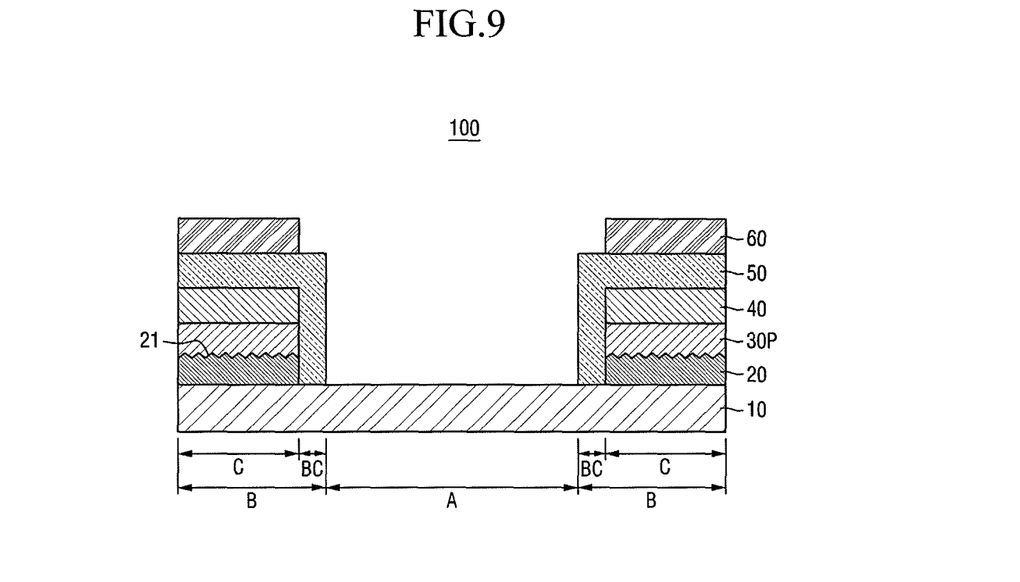

Referring to FIG. 9, the third light-blocking layer pattern 60 may be formed on the surface of the second light-blocking layer pattern 50. The third light-blocking layer pattern 60 may be a third printed layer printed in colored or colorless ink.

In an example, each of the first light-blocking layer pattern 40 and the second light-blocking layer pattern 50 may be a color printed layer which is printed in colored ink excluding black, and the third light-blocking layer pattern 60 may be a black printed layer which is printed in black. However, embodiments are not limited thereto.

Figure 10:
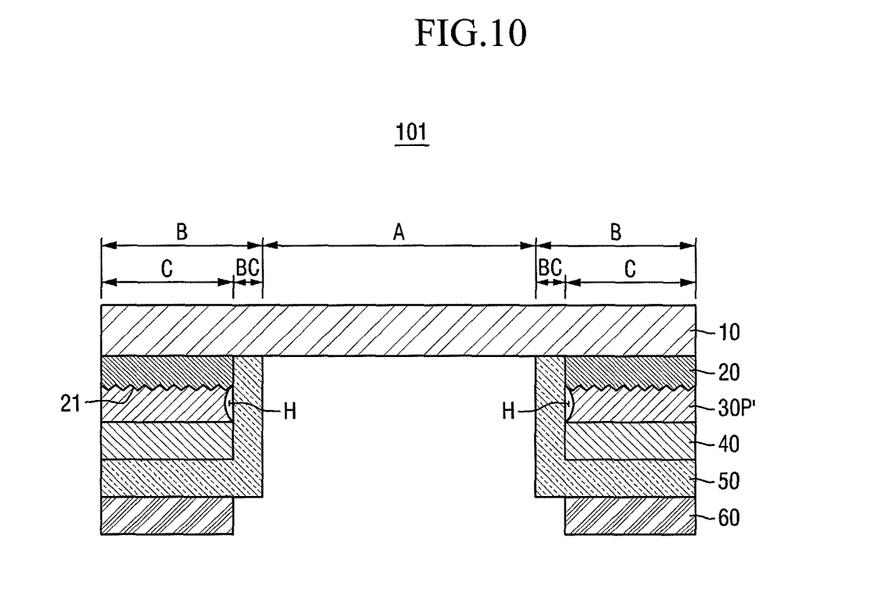
FIG. 10 illustrates a cross-sectional view of a cover window according to another embodiment.

FIG. 10 illustrates a cross-sectional view of a cover window 101 according to a second embodiment.

The cover window 101 of FIG. 10 is different from the cover window 100 of FIGS. 1-2 in that a groove H is formed in an inner side surface of a metal layer pattern 30P'. The groove H formed in the inner side surface of the metal layer pattern 30P' may be an area formed by over-etching a surface of a light-transmitting substrate 10 when the surface of the light-transmitting substrate 10 excluding a first area C is etched using a first light-blocking layer pattern 40 as a mask. The groove H is covered with a second light-blocking layer pattern 50 and thus is not visible from the outside.

In FIG. 10, the groove H is formed only in the inner side surface of the metal layer pattern 30P' of the cover window 101. However, the groove H can also be formed in an inner side surface of a raised and recessed pattern layer 20 and an inner side surface of the first light-blocking layer pattern 40.

Figure 11:
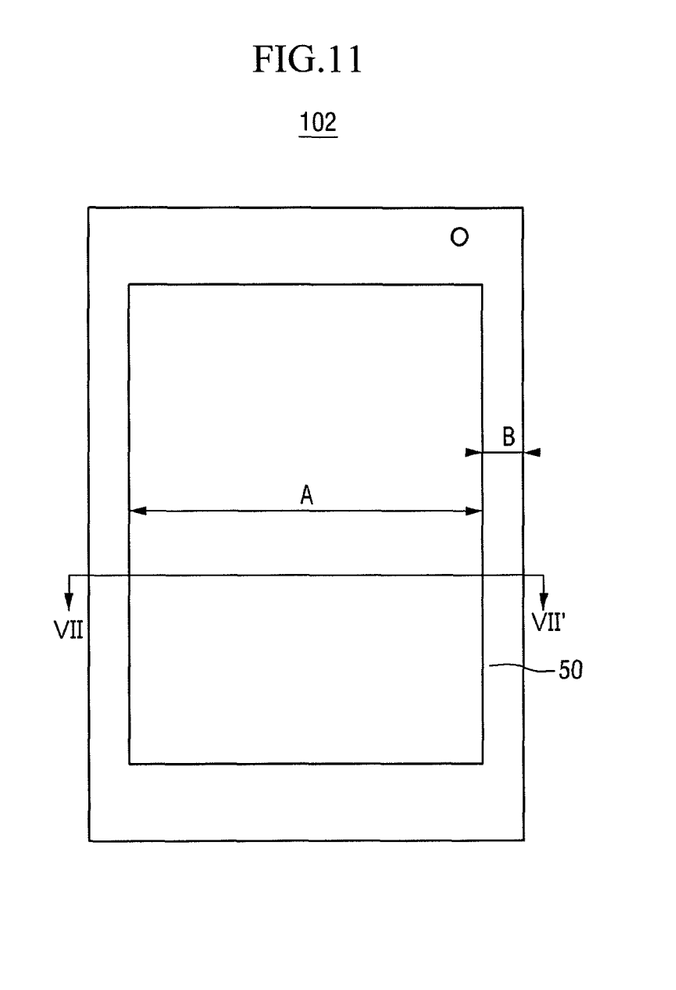
FIG. 11 illustrates a plan view of a cover window according to yet another embodiment.
Figure 12:
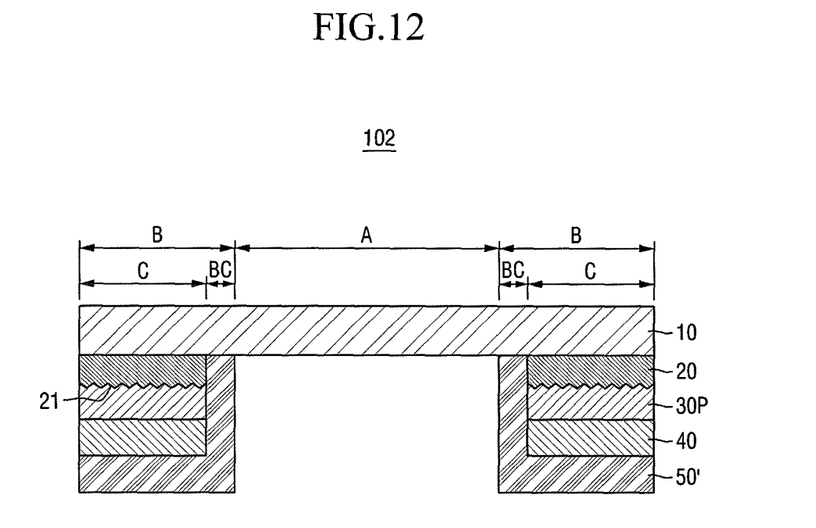
FIG. 12 illustrates a cross-sectional view taken along line VII-VII' of FIG. 11.

FIG. 11 illustrates a plan view of a cover window 102 according to a third embodiment. FIG. 12 illustrates a cross-sectional view taken along line VII-VII' of FIG. 11.

The cover window 102 of FIG. 11 is different from the cover window 100 of FIGS. 1-2 in that the first area C of the light-transmitting area B is not seen when viewed from above (FIG. 11). However, referring to FIG. 12, the cover window 102 may include the light-transmitting area A and the light-blocking area B surrounding the light-transmitting area A, and the first area C and the second area BC may exist in the light-blocking area B.

As described above, each of the first light-blocking layer pattern 40 and the second light-blocking layer pattern 50 of the cover window 100 of FIG. 2 may be a color printed layer which is printed in colored ink excluding black, and the third light-blocking layer pattern 60 may be a black printed layer which is printed in black. Therefore, since the second light-blocking layer pattern 50 and the third light-blocking layer pattern 60 of the cover window 100 of FIG. 2 have different colors, the second light-blocking layer pattern 50 of the second area BC which is larger than the third light-blocking layer pattern 60 is visible from the outside. However, in the cover window 102 of FIG. 11, since a second light-blocking layer pattern 50' is a black printed layer, the first area C may not be visible when viewed from above.

Figure 13:
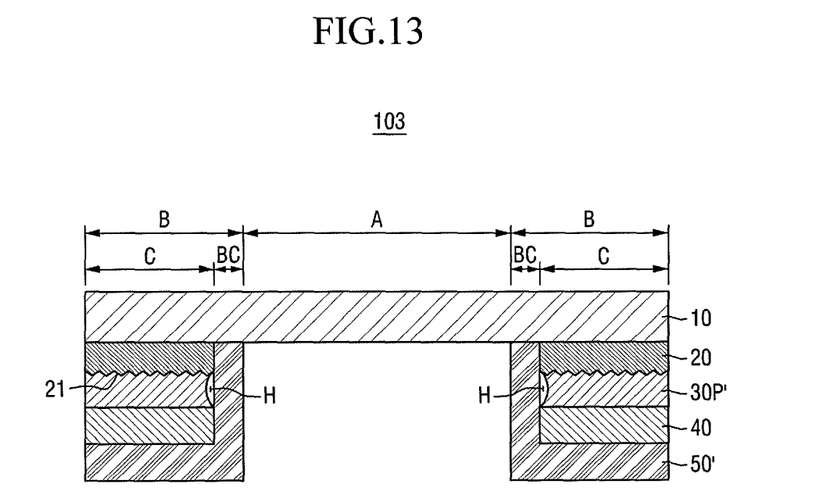
FIG. 13 illustrates a cross-sectional view of a cover window according to still another embodiment.

FIG. 13 illustrates a cross-sectional view of a cover window 103 according to a fourth embodiment. The cover window 103 of FIG. 13 is different from the cover window 102 of FIG. 12 in that the third light-blocking layer pattern 60 is not formed on a surface of a second light-blocking layer pattern 50', which is a black printed layer.

Figure 14:
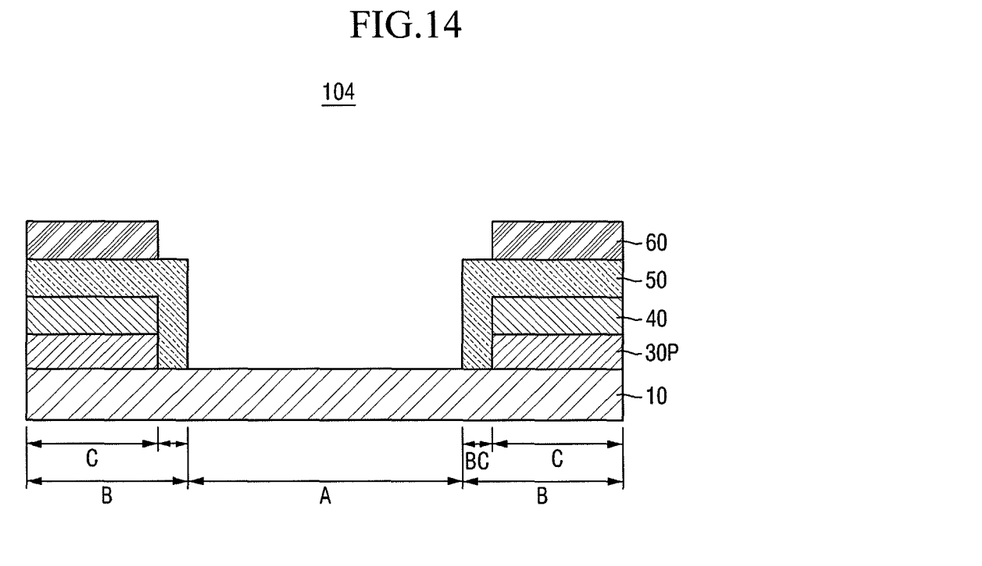
FIG. 14 illustrates a cross-sectional view of a cover window according to yet another embodiment.

FIG. 14 illustrates a cross-sectional view of a cover window 104 according to a fifth embodiment. Referring to FIG. 14, the cover window 104 is different from the cover window 100 of FIG. 2 in that the metal layer pattern 30P is directly on a surface of the first area C of a light-transmitting substrate 10, i.e., without the raised and recessed pattern layer 20.

FIGS. 15 through 18 illustrate views of stages in a method of manufacturing the cover window 104.

Figure 15:
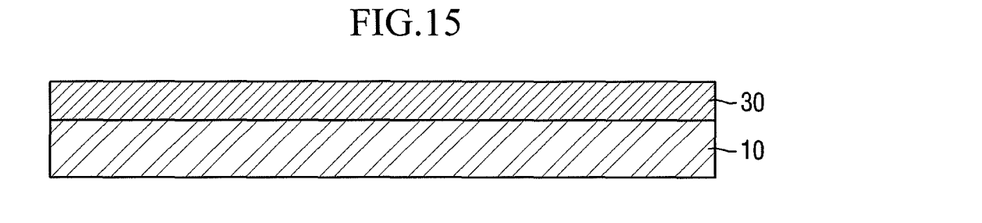
FIGS. 15 through 18 illustrate views of stages in a method of manufacturing the cover window in FIG. 14.
Figure 16:
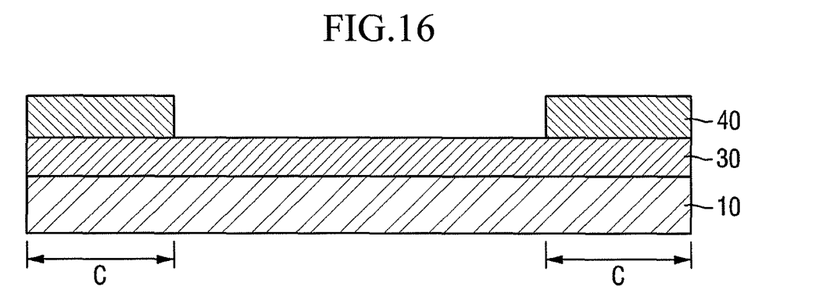
Figure 17:
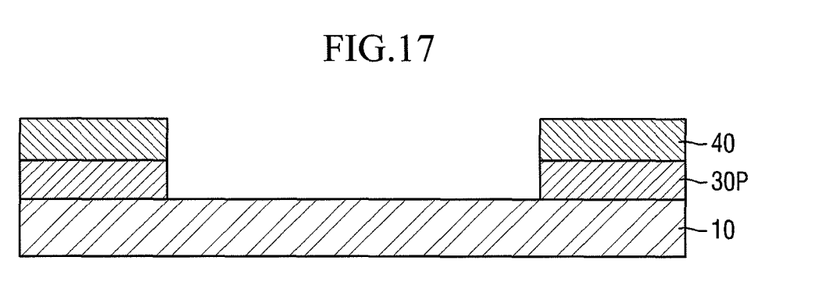
Figure 18:
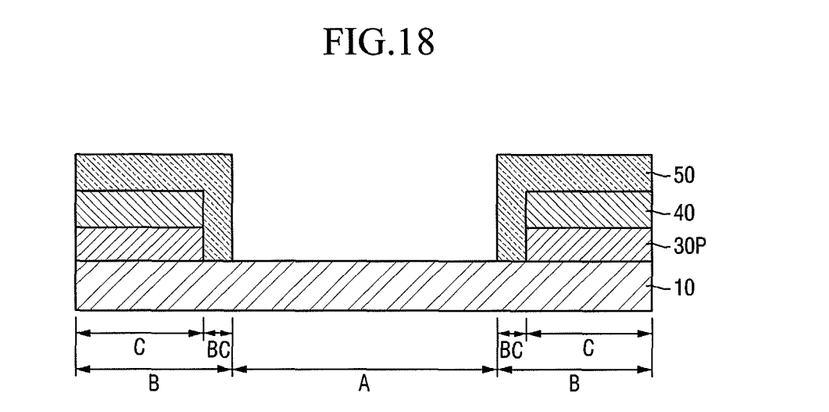

Referring to FIG. 15, the cover window 104 is different from the cover window 100 of FIG. 5 in that the metal layer 30 is formed on the whole surface of the light-transmitting substrate 10 and that no step is formed on a surface of the metal layer 30. The cover window 104 of FIGS. 16 through 18 is different from the cover window 100 of FIGS. 6 through 8 in that the raised and recessed pattern layer 20 is not formed.

Figure 19:
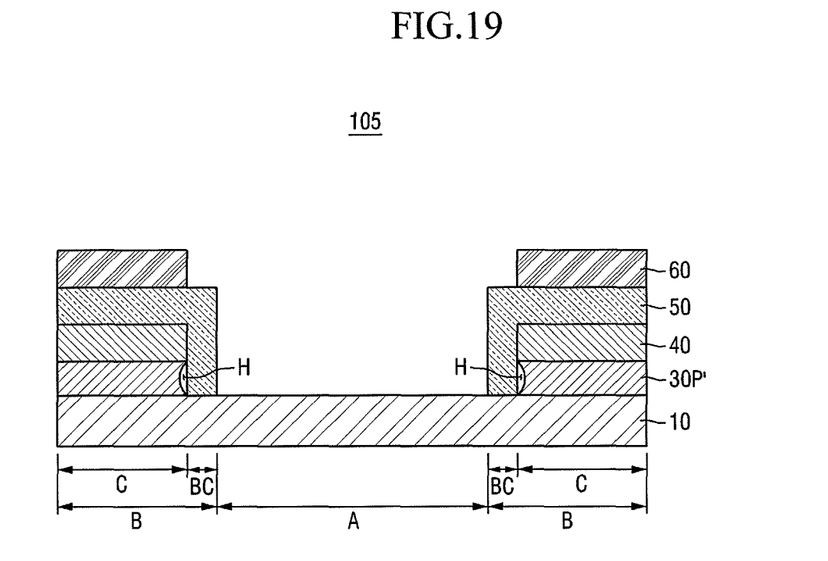
FIG. 19 illustrates a cross-sectional view of a cover window according to still another embodiment.

FIG. 19 illustrates a cross-sectional view of a cover window 105 according to a sixth embodiment. The cover window 105 of FIG. 19 is different from the cover window 101 of FIG. 10 in that the raised and recessed pattern layer 20 is not formed.

The above description may apply the same to a light-transmitting area 70 in which a camera is installed.

Figure 20:
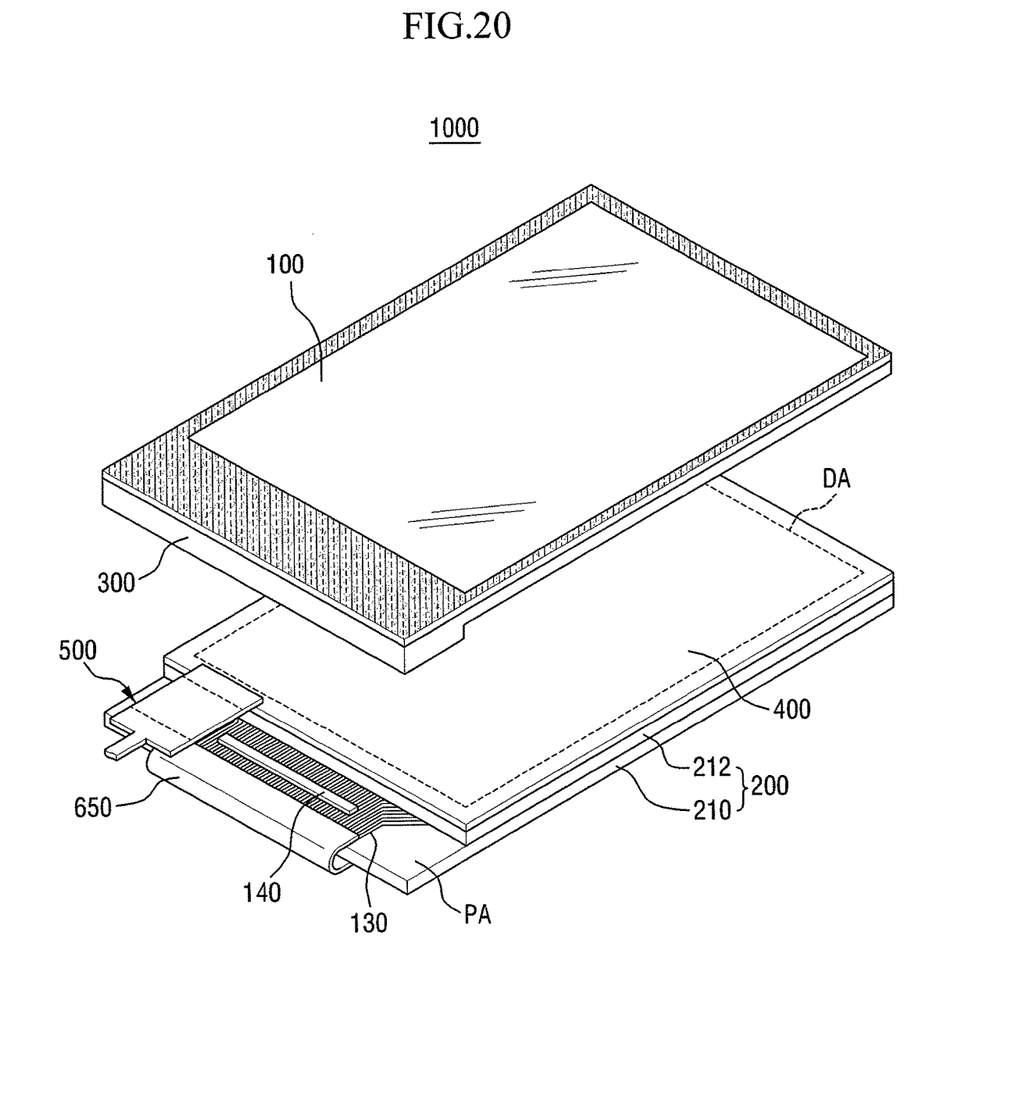
FIG. 20 illustrates an exploded perspective view of a display device according to an embodiment.

FIG. 20 illustrates an exploded perspective view of a display device 1000 according to an embodiment.

Referring to FIG. 20, the display device 1000 may include a cover window 100, a display panel 200 which is disposed under the cover window 100 and displays an image, a touchscreen pattern 400 which is disposed between the cover window 100 and the display panel 200, a touchscreen circuit film 500 which is connected to the touchscreen panel 400, and an adhesive resin layer 300 which is disposed between the cover window 100 and the touchscreen panel 400.

The display panel 200 may include a first substrate 210 which includes a display area DA and a pad area PA, and a second substrate 212 which is bonded onto the first substrate 210. Each of the first substrate 210 and the second substrate 212 may be made of, e.g., a glass or polymer film. A plurality of signal lines (including scan lines and data lines) and a plurality of pixels may be located in the display area DA of the first substrate 210, and a plurality of metal wirings 130 connected to the signal lines may be located in the pad area PA.

The display panel 200 may be, but is not limited to, an organic light-emitting display panel. If the display panel 200 is an organic light-emitting display panel, the pixels of the first substrate 210 may emit light toward the second substrate 212, and an outer surface of the second substrate 212 may be a display surface of the display panel 200. The second substrate 212 may be smaller in size than the first substrate 210, and may be attached to the display area DA of the first substrate 210. The first substrate 210 and the second substrate 212 may be integrally bonded with each other by a sealant (not illustrated) coated along edges of the second substrate 212.

The display panel 200 may include an integrated circuit (IC) chip 140 mounted on the pad area PA using a chip-on-glass (COG) method. The IC chip 140 may include any one of a scan driver and a data driver. The scan driver may provide scan signals to the pixels through the scan lines, and the data driver may provide data signals to the pixels through the data lines.

The touchscreen panel 400 may be attached to the outer surface of the second substrate 212 to overlap the display area DA, and the touchscreen circuit film 500 may be electrically connected to electrodes of the touchscreen panel 400. The touchscreen circuit film 500 may be located above the pad area PA.

The resin layer 300 may be located between the display panel 200 and the cover window 100, and may bond the display panel 200 and the cover window 100 together. In detail, the resin layer 300 may fully fill a space between the touchscreen panel 400 and the cover window 100, and may partially or fully fill a space between the pad area PA and the cover window 100. The resin layer 300 may include acrylic resin that is cured by UV light. The resin layer 300 may initially be coated on the cover window 100 in a liquid or paste state, and may be cured by UV light after the display panel 200 and the cover window 100 are stacked.

The display device 1000 may further include a printed circuit board (PCB) 650 having a control circuit which transmits a control signal to the display panel 200. The PCB 650 may have flexibility and may be bent toward an opposite side of the display panel 200 from the display surface of the display panel 200 to be disposed on the opposite side of the display panel 200.

By way of summation and review, a typical cover window of a display device may include a light-transmitting area and a light-blocking area. For example, with heightened awareness of colors and increased demands for new designs, research is being conducted to impart the light-blocking area various colors and new designs.

However, in the process of developing a cover window that has a light-blocking area with a metallic texture (according to the demands of consumers), a portion of a metal layer pattern may be exposed at a boundary between the light-transmitting area and the light-blocking area or in an area of the light-blocking area in which a camera is installed. The exposed portion of the metal layer pattern may cause a cosmetic defect. Therefore, according to embodiments, a cover window with an unexposed metal layer pattern may be provided, thereby eliminating a cosmetic defect.

That is, after a first light-blocking layer pattern is formed on the whole surface of a metal layer in an area corresponding to a periphery of a light-transmitting substrate, the metal layer is partially etched using the first light-blocking layer pattern as a mask. Then, an inner side surface of the remaining metal layer pattern and a surface of the first light-blocking layer pattern are covered with a second light-blocking layer pattern. Therefore, the metal layer may be completely enclosed by the two light-blocking layers and the substrate, thereby being protected by the light-blocking layer patterns.

The metal layer pattern may not be exposed at a boundary between a light-transmitting area and a light-blocking area or in a portion of the light-blocking area in which a camera is installed. Further, external light may be reflected at the boundary between the light-transmitting area and the light-blocking area or in the portion of the light-blocking area in which the camera is installed. Therefore, a cosmetic defect can be reduced.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A cover window, comprising:
   a light-transmitting substrate, the light transmitting substrate including a light-transmitting region and a peripheral region around a perimeter of the light-transmitting region;
   a layer pattern with metallic appearance on the light-transmitting substrate, the layer pattern with metallic appearance being on the peripheral region of the light-transmitting substrate and including metal or metallic compounds, the layer pattern with metallic appearance having major top and bottom surfaces parallel to the light-transmitting substrate, and a side surface connecting the major top and bottom surfaces of the layer pattern with metallic appearance;
   a first light-blocking layer pattern on the layer pattern with metallic appearance, the first light-blocking layer pattern having major top and bottom surfaces parallel to the light-transmitting substrate, and a side surface connecting the major top and bottom surfaces of the first light-blocking layer pattern;
   a second light-blocking layer pattern on the first light-blocking layer pattern, the second light-blocking layer pattern including:
      a first portion extending on a surface of the first light-blocking layer pattern facing away from the layer pattern with metallic appearance, and
      a second portion continuous with the first portion and extending toward the light-transmitting substrate, the second portion extending on the side surfaces of the first light-blocking layer pattern and of the layer pattern with metallic appearance, such that the second portion is between the light-transmitting region and the peripheral region; and
   a groove either in the layer pattern with metallic appearance, the groove being between the side surface of the layer pattern with metallic appearance and the second portion of the second light-blocking layer pattern, or a groove in the first light-blocking layer pattern, the groove being between the side surface of the first light-blocking layer pattern and the second portion of the second light-blocking layer pattern;
   wherein the major top surface of the layer pattern with metallic appearance, the major bottom surface of the layer pattern with metallic appearance, the major top surface of the first light-blocking layer pattern, and the major bottom surface of the first light-blocking layer pattern are coextensive with one another in the direction parallel to the light-transmitting substrate.

2. The cover window as claimed in claim 1, further comprising a raised and recessed pattern layer between the light-transmitting substrate and the layer pattern with metallic appearance, the raised and recessed pattern layer having a raised and recessed pattern on a surface thereof.

3. The cover window as claimed in claim 1, further comprising a third light-blocking layer pattern on the second light-blocking layer pattern, the third light-blocking layer pattern overlapping the first light-blocking layer pattern.

4. The cover window as claimed in claim 1, wherein the layer pattern with metallic appearance includes titanium oxide or silicon oxide.

5. A display device, comprising:
   a cover window; and
   a display panel displaying an image in a light-transmitting area of the cover window, wherein the cover window includes:
      a light-transmitting substrate, the light-transmitting substrate including the light-transmitting area and a peripheral region around a perimeter of the light-transmitting area,
      a layer pattern with metallic appearance on the light-transmitting substrate, the layer pattern with metallic appearance being on the peripheral region of the light-transmitting substrate and including metal or metallic compounds, the layer pattern with metallic appearance having major top and bottom surfaces parallel to the light-transmitting substrate, and a side surface connecting the major top and bottom surfaces of the layer pattern with metallic appearance;
      a first light-blocking layer pattern on the layer pattern with metallic appearance, the first light-blocking layer pattern having major top and bottom surfaces parallel to the light-transmitting substrate, and a side surface connecting the major top and bottom surfaces of the first light-blocking layer pattern;
      a second light-blocking layer pattern on the first light-blocking layer pattern, the second light-blocking layer pattern including:
         a first portion extending on a surface of the first light-blocking layer pattern facing away from the layer pattern with metallic appearance, and
         a second portion continuous with the first portion and extending toward the light-transmitting substrate, the second portion extending on the side surfaces of the first light-blocking layer pattern and of the layer pattern with metallic appearance, such that the second portion is between the light-transmitting region and the peripheral region; and
      a groove either in the layer pattern with metallic appearance, the groove being between the side surface of the layer pattern with metallic appearance and the second portion of the second light-blocking layer pattern, or a groove in the first light-blocking layer pattern, the groove being between the side surface of the first light-blocking layer pattern and the second portion of the second light-blocking layer pattern;
      wherein the major top surface of the layer pattern with metallic appearance, the major bottom surface of the layer pattern with metallic appearance, the major top surface of the first light-blocking layer pattern, and the major bottom surface of the first light-blocking layer pattern are coextensive with one another in the direction parallel to the light-transmitting substrate.

6. The display device as claimed in claim 5, further comprising a raised and recessed pattern layer between the light-transmitting substrate and the layer pattern with metallic appearance and has a raised and recessed pattern on a surface thereof.

7. The display device as claimed in claim 5, further comprising a third light-blocking layer pattern on the second light-blocking layer pattern and overlapping the first light-blocking layer pattern.

8. A method of manufacturing a cover window, the method comprising:
- depositing a layer with metallic appearance on a surface of a light-transmitting substrate, the layer with metallic appearance including metal or metallic compounds, and the light transmitting substrate including a light-transmitting region and a peripheral region around a perimeter of the light-transmitting region;
- performing a first printing operation to form a first light-blocking layer pattern on a periphery of the layer with metallic appearance, the first light-blocking layer pattern having major top and bottom surfaces parallel to the light-transmitting substrate, and a side surface connecting the major top and bottom surfaces of the first light-blocking layer pattern;
- forming a layer pattern with metallic appearance by partially removing the layer with metallic appearance using the first light-blocking layer pattern as a mask, such that the layer pattern with metallic appearance is on the peripheral region of the light-transmitting substrate, and the first light-blocking layer pattern is on the layer pattern with metallic appearance, the layer pattern with metallic appearance having major top and bottom surfaces parallel to the light-transmitting substrate, and a side surface connecting the major top and bottom surfaces of the layer pattern with metallic appearance;
- performing a second printing operation to form a second light-blocking layer pattern on the first light-blocking layer pattern, such that the second light-blocking layer pattern includes:
  - a first portion extending on a surface of the first light-blocking layer pattern facing away from the layer pattern with metallic appearance, and
  - a second portion continuous with the first portion and extending toward the light-transmitting substrate, the second portion extending on side surfaces of the first light-blocking layer pattern and of the layer pattern with metallic appearance, such that the second portion is between the light-transmitting region and the peripheral region;
- forming a groove either in the layer pattern with metallic appearance, the groove being between the side surface of the layer pattern with metallic appearance and the second portion of the second light-blocking layer pattern, or a groove in the first light-blocking layer pattern, the groove being between the side surface of the first light-blocking layer pattern and the second portion of the second light-blocking layer pattern;
- wherein the major top surface of the layer pattern with metallic appearance, the major bottom surface of the layer pattern with metallic appearance, the major top surface of the first light-blocking layer pattern, and the major bottom surface of the first light-blocking layer pattern are coextensive with one another in the direction parallel to the light-transmitting substrate.

9. The method as claimed in claim 8, further comprising performing a third printing operation to form a third light-blocking layer on the second light-blocking layer pattern.

10. The method as claimed in claim 8, further comprising:
- coating a layer of ultraviolet (UV) curable resin on a surface of a periphery of the light-transmitting substrate;
- forming a raised and recessed pattern on the layer of UV curable resin; and
- curing the raised and recessed pattern by irradiating UV light to form a raised and recessed pattern layer.

11. The method as claimed in claim 10, wherein the first light-blocking layer pattern on the layer with metallic appearance overlaps the entire raised and recessed pattern layer.

* * * * *